(12) United States Patent
Gai et al.

(10) Patent No.: US 11,177,336 B2
(45) Date of Patent: Nov. 16, 2021

(54) DISPLAY SUBSTRATE, REPAIRING METHOD THEREOF AND DISPLAY PANEL

(71) Applicant: BOE Technology Group Co., Ltd., Beijing (CN)

(72) Inventors: Cuili Gai, Beijing (CN); Baoxia Zhang, Beijing (CN); Ling Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 97 days.

(21) Appl. No.: 16/334,551

(22) PCT Filed: Aug. 31, 2018

(86) PCT No.: PCT/CN2018/103378
§ 371 (c)(1),
(2) Date: Mar. 19, 2019

(87) PCT Pub. No.: WO2019/080640
PCT Pub. Date: May 2, 2019

(65) Prior Publication Data
US 2020/0357874 A1    Nov. 12, 2020

(30) Foreign Application Priority Data

Oct. 27, 2017   (CN) .......................... 201711026409.0

(51) Int. Cl.
*H01L 27/32*    (2006.01)
(52) U.S. Cl.
CPC .... *H01L 27/3276* (2013.01); *H01L 2251/568* (2013.01)
(58) Field of Classification Search
CPC ... H01L 33/486; H01L 33/502; H01L 33/505; H01L 33/507; H01L 33/54; H01L 33/56;
(Continued)

(56) References Cited

U.S. PATENT DOCUMENTS 5,600,460 A  *  2/1997  Yamamoto ............ G02F 1/1309
                                                        349/139
2007/0114918 A1*  5/2007  Arai ..................... G09G 3/3233
                                                        313/504
(Continued)

FOREIGN PATENT DOCUMENTS

CN       101408683 A       4/2009
CN       101788739 A       7/2010
(Continued)

OTHER PUBLICATIONS

International Search Report and Written Opinion of the International Searching Authority (with English language translation), International Application No. PCT/CN2018/103378, dated Nov. 21, 2018, 12 pp.

(Continued)

*Primary Examiner* — Zandra V Smith
*Assistant Examiner* — Andre C Stevenson
(74) *Attorney, Agent, or Firm* — Myers Bigel, P.A.

(57) ABSTRACT

A method for repairing a display substrate includes detecting whether there is a fault point on signal lines. If a fault point is detected on a signal line, short-circuiting is performed of two sides of the at least one fault point through line portions of two drive power lines respectively located at two sides of the at least one fault point and perpendicular to the signal line where the at least one fault point is located and a line portion of a drive power line located at one side of the at least one fault point and parallel to the signal line where the at least one fault point is located.

12 Claims, 7 Drawing Sheets

(58) Field of Classification Search
CPC ....... H01L 2933/0041; H01L 2933/005; G02F 1/1335; B32B 2457/206
See application file for complete search history.

(56) References Cited

U.S. PATENT DOCUMENTS

| | | |
|---|---|---|
| 2010/0265424 A1 | 10/2010 | Chiu et al. |
| 2012/0300165 A1 | 11/2012 | Zhuang et al. |
| 2014/0117860 A1 | 5/2014 | Kim et al. |
| 2017/0038652 A1 | 2/2017 | Hua et al. |
| 2017/0336688 A1* | 11/2017 | Yamamoto ............ G02F 1/1345 |
| 2018/0102396 A1 | 4/2018 | Han |

FOREIGN PATENT DOCUMENTS

| | | |
|---|---|---|
| CN | 102169267 A | 8/2011 |
| CN | 103035204 A | 4/2013 |
| CN | 103794175 A | 5/2014 |
| CN | 104965325 A | 10/2015 |
| CN | 105590573 A | 5/2016 |
| CN | 107731878 A | 2/2018 |
| JP | 201072397 A | 4/2010 |

OTHER PUBLICATIONS

Notice of First Review and English language translation, CN Application No. 201711026409.0, dated Aug. 1, 2019, 14 pp.

* cited by examiner

DISPLAY SUBSTRATE, REPAIRING METHOD THEREOF AND DISPLAY PANEL

CROSS REFERENCE TO RELATED APPLICATIONS

The present application is a 35 U.S.C. 371 national stage application of PCT International Application No. PCT/CN2018/103378, filed on Aug. 31, 2018, which claims the benefit of Chinese Patent Application No. 201711026409.0 filed on Oct. 27, 2017, the contents of which are incorporated herein by reference in their entireties.

TECHNICAL FIELD

The present disclosure relates to the technical field of displays, in particular to a display substrate, a repairing method thereof and a display panel.

BACKGROUND

At present, the display substrate is provided with scanning signal lines and data signal lines therein, and when the scanning signal lines and the data signal lines have a circuit breaking fault or short-circuit fault, bright lines or dark lines exist in the display panel adopting the display substrate during display, thus decreasing the yield of the display panel.

SUMMARY

In view of this, the present disclosure provides a display substrate, a repairing method thereof, and a display panel.

According to a first aspect of the present disclosure, there is provided a method for repairing a display substrate, wherein the display substrate includes a substrate which is provided thereon with:

a plurality of light emitting units;

a plurality of signal lines, the signal lines including signal lines extending along a transverse direction of the substrate and signal lines extending along a longitudinal direction of the substrate, which are insulated from each other;

a plurality of drive power lines, including drive power lines extending along the transverse direction of the substrate and drive power lines extending along the longitudinal direction of the substrate, which are mutually connected and are used for providing a driving voltage to each light emitting unit, wherein the drive power lines are insulated from the signal lines, Wherein the method comprises the following steps:

Step S0: detecting whether there is a fault point on the signal lines;

Step S1: when a fault point is detected on a signal line, two sides of at least one fault point are short-circuited through line portions of two drive power lines respectively located at two sides of the at least one fault point and perpendicular to the signal line where the at least one fault point is located and a line portion of a drive power line located at one side of the at least one fault point and parallel to the signal line where the at least one fault point is located.

Optionally, the two drive power lines located at the two sides of at least one fault point respectively and perpendicular to the signal line where the at least one fault point is located are referred to as first repair lines, and the one drive power line located at one side of the at least one fault point and parallel to the signal line where the at least one fault point is located is referred to as a second repair line, then the step S1 comprises:

welding the first repair lines and the signal line where the fault point is located in the thickness direction of the substrate by laser respectively.

Optionally, the step S1 further comprises:

disconnecting extension lines at two sides of the line portions of the first repair lines for short-circuiting by laser respectively;

disconnecting extension lines at two sides of the line portion of the second repair lines for short-circuiting by laser.

Optionally, the step S1 further comprises:

disconnecting line portions located between the fault point and the welded positions of the signal line where the fault point is located by laser.

Optionally, when the number of the at least one fault point is a plurality and the distance between every two adjacent fault points is less than or equal to a first preset value, two welded positions are set, and the two welded positions are positioned at two ends of all the plurality of fault points along an extending direction of the signal line where the fault point is located;

When the number of the at least one fault point is a plurality and the distance between some adjacent fault points of the fault points is greater than the first preset value, the plurality of fault points are divided into at least two fault point groups, so that each fault point group comprises one fault point or a plurality of fault points, the distance between every two adjacent fault points in one fault point group is less than or equal to the first preset value, the distance between fault points in different fault point groups is greater than the first preset value, and two welded positions are respectively set for each fault point group, and the two welded positions are positioned at two ends of all the fault points in each fault group along the extending direction of the signal line where the fault points are located.

Optionally, disconnecting the extension lines of the line portions of the first repair lines for short-circuiting by laser respectively comprises, disconnecting extension lines of short-circuited line portions of two drive power lines which are located at two sides of the fault point and perpendicular to the signal line where the fault point is located and closest to the fault point;

disconnecting the extension lines at two sides of the line portion of the second repair line for short-circuiting by laser comprises: disconnecting extension lines at two sides of short-circuited line portion of the drive power line which is located at one side of the fault point, parallel to the signal line where the fault point is located and closest to the fault point.

According to a second aspect of the present disclosure, there is provided a display substrate, such as an AMOLED display substrate, comprising a substrate which is provided with thereon:

a plurality of light emitting units;

a plurality of signal lines, the signal lines including signal lines extending along a transverse direction of the substrate and signal lines extending along a longitudinal direction of the substrate, which are insulated from each other;

a plurality of drive power lines, including drive power lines extending along the transverse direction of the substrate and drive power lines extending along the longitudinal direction of the substrate, which are mutually connected, and are used for providing a driving voltage to each light emitting unit, wherein the drive power lines are insulated from the signal lines, Wherein if at least one of the plurality of signal lines has a fault point, the two sides of the at least one fault point are short-circuited through line portions of two drive power lines respectively positioned at two sides of the at least one fault point and perpendicular to the signal line where the at least one fault point is located and a line portion of a drive power line positioned at one side of the at least one fault point and parallel to the signal line where the at least one fault point is located.

Optionally, the two drive power lines located at two sides of at least one fault point and perpendicular to the signal line where the at least one fault point is located are referred to as first repair lines, and the one drive power line located at one side of the at least one fault point and parallel to the signal line where the at least one fault point is located is referred to as a second repair line, and the first repair lines and the signal line where the fault point is located are respectively welded in the thickness direction of the substrate.

Optionally, the extension lines at two sides of the short-circuited line portions of the first repair lines are disconnected respectively; the extension lines at two sides of the short-circuited line portion of the second repair line are disconnected respectively.

Optionally, the first repair lines are two drive power lines which are respectively located at two sides of the fault point, and perpendicular to the signal lines where the fault point is located and closest to the fault point; the second repair line is a drive power line located at one side of the fault point, parallel to the signal line where the fault point is located and closest to the fault point.

Optionally, the line portions between the fault point and the welded positions of the signal line where the fault point is located are disconnected.

Optionally, the number of the at least one fault point is a plurality, the distance between every two adjacent fault points is less than or equal to a first preset value, and the welded positions are two, and the two welded positions are positioned at the two ends of all the plurality fault points along the extending direction of the signal line where the fault points are located.

Optionally, the number of the at least one fault point is a plurality, the distance between some adjacent fault points of the plurality of fault points is greater than the first preset value, the plurality of fault points are located in at least two fault point groups, each fault point group comprises one fault point or a plurality of fault points, the distance between every two adjacent fault points in each fault point group is less than or equal to the first preset value, the distance between two fault points in different fault point groups is greater than the first preset value, and each fault point group is provided with two welded positions respectively, and the two welded positions are located at two ends of all the fault points in the fault point group along the extending direction of the signal line where the fault points are located.

Optionally, each row of light-emitting units along a transverse direction of the substrate and/or each column of light-emitting units along a longitudinal direction of the substrate comprise corresponding two parallel driving power lines.

Optionally, the fault point is a circuit breaking point or a short-circuit point.

According to a third aspect of the present disclosure, there is provided a display panel, such as an AMOLED display panel, comprising the above-mentioned display substrate.

DETAILED DESCRIPTION

In order to make the technical problems, technical solutions and advantages to be solved in the embodiments of the present disclosure clearer, the following will be described in detail with reference to the drawings and specific embodiments.

Figure 8:
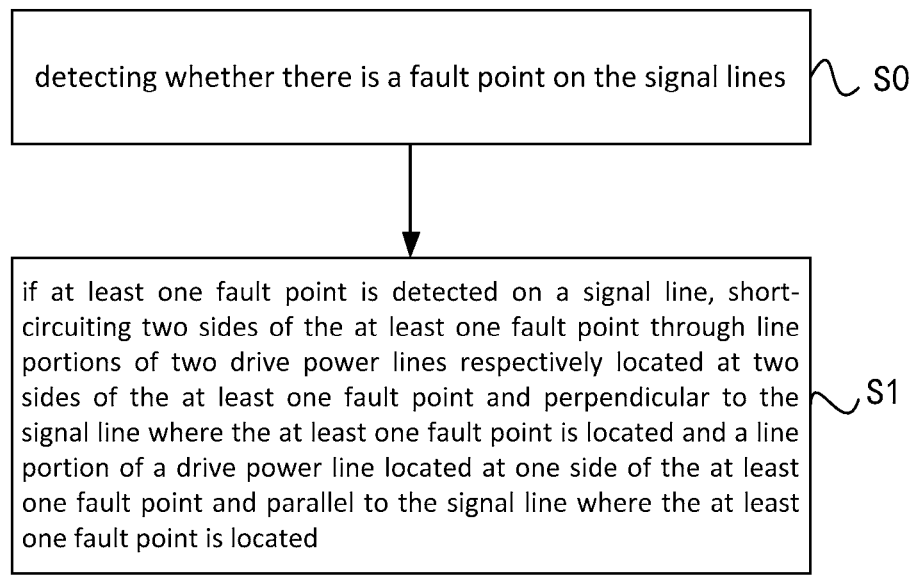
FIG. 8 is a schematic flow chart of a method for repairing a display substrate according to an embodiment of the present disclosure.

Referring to FIG. 8, an embodiment of the present disclosure provides a method for repairing a display substrate. The display substrate includes a substrate which is provided with thereon:

a plurality of light emitting units;

a plurality of signal lines, the signal lines including signal lines extending along a transverse direction of the substrate and signal lines extending along a longitudinal direction of the substrate, which are insulated from each other;

a plurality of drive power lines, including drive power lines extending along the transverse direction of the substrate and drive power lines extending along the longitudinal direction of the substrate, which are mutually connected and are used for providing a driving voltage to each light emitting unit, wherein the drive power lines are insulated from the signal lines, Wherein the method comprises the following steps:

step S0: detecting whether there is a fault point on the signal lines;

step S1: when a fault point is detected on a signal line, two sides of the at least one fault point are short-circuited through line portions of two drive power lines respectively located at two sides of the at least one fault point and perpendicular to the signal line where the at least one fault point is located and a line portion of a drive power line located at one side of the at least one fault point and parallel to the signal line where the at least one fault point is located.

The display panel mainly includes a display substrate and a cover plate glass. The display substrate is provided with a plurality of light emitting units, which are generally arranged in a matrix. The light emitting units are, for example, organic light emitting units, quantum dot light emitting units or LED light emitting units, etc. The display substrate may also include drive circuits, which generally includes switching transistors and driving transistors, and the display substrate further includes signal lines, drive power lines, etc.

For example, the AMOLED (Active Matrix/Organic Light Emitting Diode) display panel is a display panel with active matrix organic light emitting diodes. The display panel mainly includes an AMOLED display substrate (hereinafter referred to as the display substrate) and a cover glass. A plurality of organic light emitting units are arranged on the display substrate. Each organic light emitting unit mainly includes an organic light emitting diode, a driving circuit and the like, and the driving circuit usually includes a switching transistor and a driving transistor.

The signal lines usually include a plurality of scanning signal lines and a plurality of data signal lines. The scanning signal lines generally extend along a transverse direction of the substrate. The gates of all switching transistor located in a transverse row are connected in parallel by a scanning signal line. Each scanning signal line is used for transmitting scanning signals, providing switching voltages to the gates of all the switching transistor connected with the scanning signal line, and controlling each switching transistor connected with the scanning signal line to be turned on or off.

The data signal lines generally extend along the longitudinal direction of the substrate. The drains of all switching transistors located in one longitudinal column are connected in parallel by a data signal line. Each data signal line is used for transmitting data signals, providing pixel voltages to the sources of all the switching transistors connected with the data signal line, and controlling the brightness of each organic light emitting unit.

Of course, the scanning signal lines may be arranged to extend in the longitudinal direction of the substrate, and the data signal lines may be arranged to extend in the transverse direction of the substrate, and this embodiment is not limited in this respect.

Driving power lines, also called VDD lines, are connected to the source of each driving transistor, and provide driving voltages for each light emitting diode through each driving transistor to control each light emitting unit to emit light. The drive power lines include drive power lines extending along the transverse direction of the substrate and drive power lines extending along the longitudinal direction of the substrate, and the drive power lines in both directions are connected to each other to form a mesh wiring to provide a driving voltage to each light emitting unit. The drive power lines are usually uniformly distributed, which can avoid the inconsistency of the driving voltages caused by voltage drop of the drive power lines and improve the display uniformity.

For organic light emitting diodes, each organic light emitting unit may further include a compensating transistor and a sensing transistor or other circuit structure, etc. At this time, corresponding sensing signal lines or other types of signal lines extending along the transverse direction or along the longitudinal direction of the substrate may be provided on the substrate according to actual needs.

The signal lines in this embodiment may include various types of signal lines, for example, the above-mentioned scanning signal lines, data signal lines, sensing signal lines, and the like.

The transverse direction of the substrate usually refers to a long-side direction of the substrate, while the longitudinal direction of the substrate usually refers to a short-side direction of the substrate. Of course, it is also possible to be converse, the longitudinal direction and the transverse direction of the substrate are only relative concepts, referring to two mutually perpendicular directions.

It can be seen from the above description that the display substrate includes a plurality of signal lines. When the display substrate is completed, it is usually necessary to inspect the display substrate to detect whether there is an abnormality in the display substrate. Existing methods can be used to detect the display substrate. When a fault point is detected on a signal line, for example, when there is a circuit breaking point in a signal line or a short-circuit point between adjacent signal lines, the display panel using the display substrate will have bright lines or dark lines during display, and the display panel will be regarded as defective or unqualified products, thus decreasing the yield of the display panel.

During detection, one signal line may be found to have a fault point, or a plurality of signal lines may also be found to have fault points. The same repairing method can be used for repairing the fault point(s) of each signal line.

According to the above embodiment of the present disclosure, the signal line where the fault point is located can be repaired by short-circuiting two sides of the fault point by using line portions of two drive power lines which are respectively positioned at two sides of the fault point and are perpendicular to the signal line where the fault point is located and a line portion of one drive power line which is positioned at one side of the fault point and is parallel to the signal line where the fault point is located. After the signal line where the fault point is located is repaired, the signal transmitted in the signal line no longer passes through the position of the fault point, but instead passes through the line portions of the drive power lines short-circuiting the fault point. Therefore, the repaired signal line can normally transmit signals, so that bright lines or dark lines do not exist during display, thereby increasing the yield of the display substrate and the yield of the display panel adopting the display substrate.

A repairing method provided by an embodiment of the present disclosure will be described below with reference to FIGS. 1 and 2.

Figure 1:
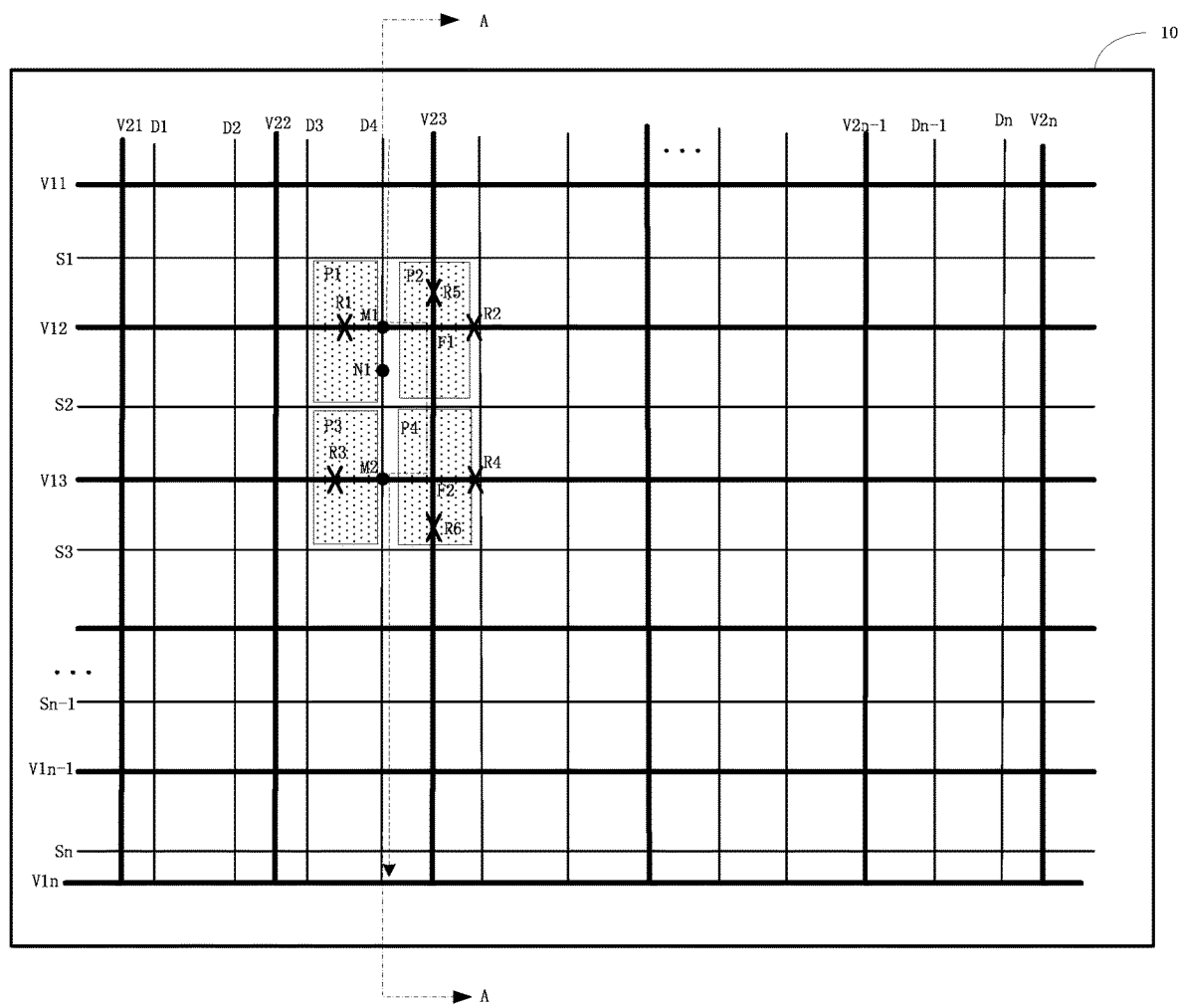
FIG. 1 is a schematic view of a display substrate in one embodiment provided by the present disclosure.
Figure 2:
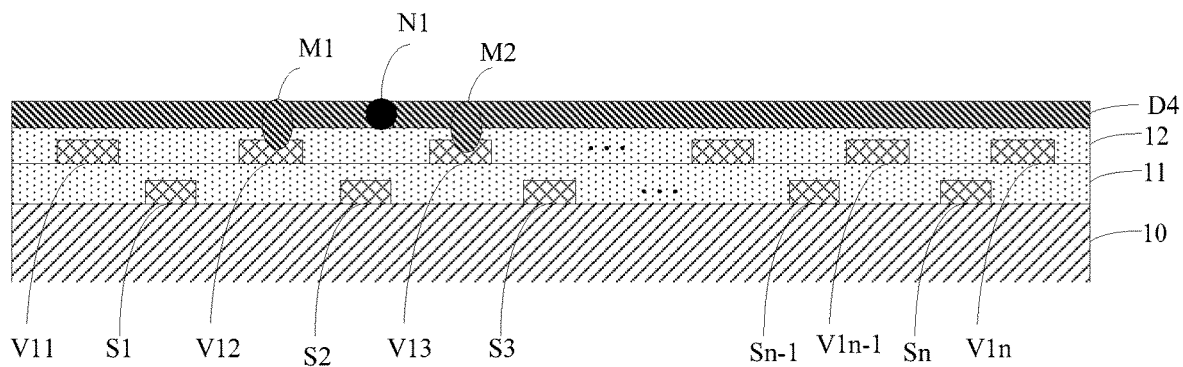
FIG. 2 is a sectional view taken along a direction A-A in FIG. 1.

FIG. 1 is a schematic view of a display substrate provided in an embodiment of the present disclosure, FIG. 2 is a cross-sectional view taken along direction A-A in FIG. 1, and FIGS. 1 and 2 only schematically show signal lines and drive power lines on the display substrate, omitting other structures on the display substrate, such as organic light emitting diodes, driving transistors, etc.

As shown in FIGS. 1 and 2, the display substrate includes a substrate 10 on which a plurality of light emitting units (not shown) are disposed.

The substrate 10 is also provided with a plurality of signal lines, and the signal lines include signal lines S1-Sn extending along a transverse direction of the substrate 10 and signal lines D1-Dn extending along a longitudinal direction of the substrate 10, which are insulated from each other.

Each organic light emitting unit is located in each area defined by intersections of the transversely extending signal lines S1-Sn and the longitudinally extending signal lines D1-Dn, for example, each rectangular area (dot areas P1, P2, P3, and P4 in FIG. 1) defined by intersections of the signal lines S1-Sn and the signal lines D1-Dn in the figure.

The substrate 10 is also provided with a plurality of driving power lines, and the driving power lines are used for providing driving voltage for each light emitting unit.

The drive power lines are insulated from the signal lines, and comprises drive power lines V11-V1n extending along the transverse direction of the substrate 10 and drive power lines V21-V2n extending along the longitudinal direction of the substrate 10, which are connected with each other.

Step S1 in the above embodiment may be: when a fault point is detected on a signal line, for example, when a fault point N1 is detected on a signal line D4 extending along the longitudinal direction of the substrate 10 shown in FIG. 1, at this time, two drive power lines V12 and V13 located at two sides of the fault point N1 and perpendicular to the signal line D4 where the fault point N1 is located may be welded with the signal line D4 where the fault point N1 is located in the thickness direction of the substrate 10, respectively.

It should be noted that, as shown in FIG. 2, the drive power lines (only the drive power lines V11-V1n extending along the transverse direction of the substrate 10 are shown in FIG. 2) are insulated from the signal lines S1-Sn extending along the transverse direction of the substrate 10 by a first insulating layer 11 disposed therebetween. Of course, the drive power lines V21-V2n extending along the longitudinal direction of the substrate 10, not shown in FIG. 2, are insulated from the signal lines S1-Sn by the first insulating layer 11.

The drive power lines (only the drive power lines V11-V1n extending along the transverse direction of the substrate 10 are shown in FIG. 2) are insulated from the signal lines extending along the longitudinal direction of the substrate 10 (only one D4 of the signal lines is shown in FIG. 2) by a second insulating layer 12 therebetween. Of course, the signal lines D1-Dn extending along the longitudinal direction of the substrate 10, not shown in FIG. 2, are also insulated from the drive power lines by the second insulating layer 12.

Signal lines S1-Sn extending along the transverse direction of the substrate 10 are insulated from signal lines D1-Dn extending along the longitudinal direction of the substrate 10 by the first insulating layer 11 and the second insulating layer 12 therebetween.

FIG. 2 shows only one positional relationship between signal lines and drive power lines, i.e., signal lines S1-Sn extending along the transverse direction of the substrate 10, drive power lines (only drive power lines V11-V1n extending along the transverse direction are shown in FIG. 2) and signal lines extending along the longitudinal direction of the substrate 10 (only one signal line D4 is shown in FIG. 2) are sequentially arranged on the substrate 10. In practical application, the positional relationship of the above three types of lines may be arranged in other ways as long as the three type of lines are insulated from each other, and this embodiment is not limited in this respect.

In this embodiment, as shown in FIGS. 1 and 2, two drive power lines V12 and V13 (respectively referred to as first repair lines) located at two sides of the fault point N1 and perpendicular to the signal line D4 where the fault point N1 is located are respectively welded with the signal line D4 where the fault point N1 is located in the thickness direction of the substrate 10.

Welding refers to electrically connecting the first repair lines V12 and V13 and the signal line D4 at two sides of the fault point N1 in the thickness direction of the substrate 10 through a molten conductive material (e.g., the material of the signal line D4), that is, the molten material of the signal line D4 is filled in the insulating layer (e.g., the second insulating layer 12 shown in FIG. 2) between the first repair lines V12 and V13 and the signal line D4.

Since orthographic projections of the two first repair lines V12 and V13 located at two sides of the fault point N1 and the signal line D4 where the fault point N1 is located towards the substrate 10 have intersection points respectively, the welded positions include an intersection point M1 of the orthographic projections of the first repair line V12 and the signal line D4 towards the substrate 10 and an intersection point M2 of the orthographic projections of the other first repair line V13 and the signal line D4 towards the substrate 10.

After welding, when the signal line D4 has a signal flowing from top to bottom in an extending direction of the signal line (i.e., when the signal is input from the top of the signal line D4), when the signal reaches the welded position M1, it does not pass through the fault point N1, instead it passes through a line portion between the welded position M1 and F1 in the first repair line V12 after passing through the welded position M1. Then, it passes through a line portion located between F1 and F2 points in a drive power line V23 (called a second repair line) located at one side of the fault point N1 and parallel to the signal line D4, and then passes through a line portion located between F2 and the welded position M2 in the other first repair line V13. After that, the signal passes through the welded position M2 and flows along the signal line D4 to the end of the signal line D4. The route through which the signal passes can be seen in a dashed line with arrow shown in FIG. 1. When the signal line D4 has a signal flowing from bottom to top along the signal line, that is, when the signal is input from the bottom of the signal line D4, the route through which the signal passes is the reverse direction of the arrow shown in FIG. 1.

In the above embodiment, the drive power lines located at two sides of the fault point are welded with the signal line where the fault point is located by laser, so that the signal line where the fault point is located can be repaired.

In an alternative embodiment, further, step S1 in the repairing method may include:

Step S2, disconnecting extension lines at two sides of the short-circuited line portions of the first repair lines by laser respectively;

Step S3, disconnecting extension lines at two sides of the short-circuited line portion of the second repair line by laser respectively.

With continued reference to FIG. 1, with the repairing method of the above embodiment, the signal line can be repaired using line portions of the drive power lines. For example, line portions of the first repair lines V12 and V13 and a line portion of the second repair line V23 are short-circuited at two sides of the fault point N1. Before the extension lines at two sides of the short-circuited line portion M1-F1 of the first repair line V12 and the extension lines at two sides of the short-circuited line portion M2-F2 of the first repair line V13 are disconnected by laser and the extension lines at two sides of the short-circuited line portion F1-F2 of the second repair line V23 is disconnected by laser, since the drive power lines are connected with each other, the first repair lines V12 and V13 and the second repair line V23 can still provide driving voltages for the corresponding light emitting units. However, since the short-circuited line portions (such as the line portion between M1 and F1, the line portion between F1 and F2, and the line portion between F2 and M2 shown in FIG. 1) may have signal of the signal line D4 flowing through at the same time, the driving voltages of the driving power lines may be affected to some extent, but the effect is small because the signal flows through the signal line for a very short time.

In order to avoid such influence, in the repairing method in this embodiment, referring to FIG. 1, the extension lines at two sides of the short-circuited line portion (line portion M1-F1 between M1 and F1) of the first repair line V12 can be disconnected by laser respectively. At this time, the extension lines at two sides of the short-circuited line portion (line portion between M1 and F1) of the first repair line V12 are disconnected respectively, and the disconnected positions are, for example, R1 and R2. The extension lines at two sides of the short-circuited line portion (line portion M2-F2 between M2 and F2) of the other first repair line V13, are disconnected respectively. At this time, the extension lines at two sides of the short-circuited line portion (line portion M2-F2 between M2 and F2) of the first repair line V13 are disconnected respectively, and the disconnected positions are, e.g., R3 and R4. The extension lines at two sides of the short-circuited line portion (line portion between F1 and F2) of the second repair line V23 are also disconnected respectively. At this time, the extension lines at two sides of the short-circuited line portion (line portion F1-F2 between F1 and F2) of the second repair line V23 are disconnected respectively, and the disconnected positions are, e.g., R5 and R6. After the first repair lines V12 and V13 and the second repair line V23 are disconnected, the line portions other than the disconnected positions can still normally provide driving voltages to the corresponding light emitting units, so that the influence on the transmission of drive signals of the driving power lines after repairing can be minimized, and the repair effect can be improved.

Figure 3:
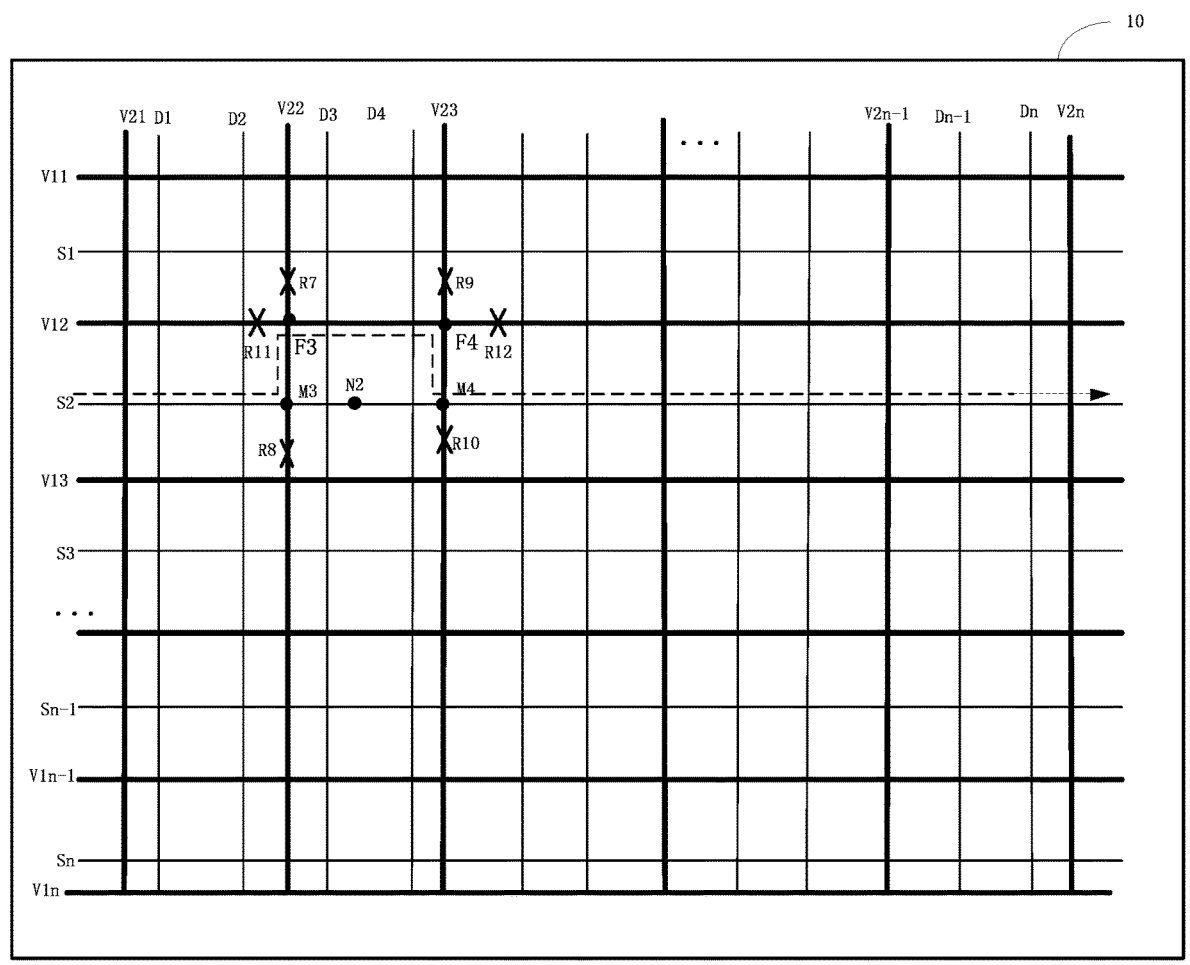
FIG. 3 is a schematic view of a display substrate in another embodiment provided by the present disclosure.

As shown in FIG. 3, when a signal line extending along the transverse direction of the substrate has a fault point, it can be repaired by a repairing method similar to repairing the signal line extending along the longitudinal direction of the substrate as shown in FIG. 1. This will be briefly described below with reference to FIG. 3.

As shown in FIG. 3, assuming that a signal line S2 extending along the transverse direction of the substrate has a fault point N2, first repair lines are drive power lines V22 and V23, a second repair line is a drive power line V12, welded positions include positions M3 and M4 on the signal line S2 located at two sides of the fault point N2, extension lines at two sides of a short-circuited line portion (line portion F3-M3 between F3 and M3) of the first repair line V22 are disconnected respectively, and the disconnected positions are, e.g., R7 and R8; extension lines at two sides of a short-circuit line (line portion F4-M4 between F4 and M4) of the other first repair line V23, respectively are disconnected, and the disconnected positions are e.g., R9 and R10; extension lines at two sides of a short-circuited line portion (line portion F3-F4 between F3 and F4) of the second repair line V12 are also disconnected respectively, the disconnected positions are, e.g., R11 and R12. After the signal line S2 is repaired, when a signal flows through the signal line S2 from left to right in an extending direction of the signal line S2, the route through which the signal passes can be shown by a dashed line with arrow shown in FIG. 3.

In some alternative examples, the first repair lines may be two drive power lines respectively located at two sides of the fault point, perpendicular to the signal line where the fault point is located and closest to the fault point. The second repair line may be a drive power line located at one side of the fault point, parallel to the signal line where the fault point is located, and closest to the fault point.

At this time, in the repairing method, disconnecting the extension lines at two sides of the short-circuited line portion of the first repair line by laser respectively as described in step S2 above, may be:

disconnecting the extension lines at two sides of the short-circuited line portions of the two drive power lines which are respectively located at two sides of the fault point, perpendicular to the signal line where the fault point is located and closest to the fault point by laser.

Disconnecting the extension lines at two sides of the short-circuited line portion of the second repair line by laser respectively in the above step S3, may be:

disconnecting the extension lines at two sides of the short-circuited line portion of the drive power line located at one side of the fault point, parallel to the signal line where the fault point is located and closest to the fault point by laser.

Referring to FIG. 1, the signal line D4 has a fault point N1, and the first repair lines V12 and V13 are the two first repair lines closest to the fault point N1, i.e., the two drive power lines located at two sides of the fault point N1, perpendicular to the signal line D4 where the fault point is located, and closest to the fault point N1. The second repair line V23 is a drive power line located at one side of the fault point N1, parallel to the signal line D4 where the fault point N1 is located, and closest to the fault point N1.

In this embodiment, as an example, the drive power lines closest to the fault point are taken as the first repair lines and the second repair lines. Of course, the first repair lines and the second repair line may be other drive power lines, for example, as shown in FIG. 1, drive power lines V11 and V13 located at two sides of the fault point N1 may be taken as the first repair lines, drive power line V21 or V22 located at the other side of the fault point N1 may be taken as the second repair line. In this way, the signal line D4 having the fault point can also be repaired. The present embodiment is not limited in this respect.

If the drive power lines closest to the fault point are used as the first repair lines and the second repair line, after the signal line is repaired, because the repair lines are closest to the fault point, the line portions short-circuiting the fault point are the shortest path lines, which can reduce the resistance difference between the repaired signal line and other signal lines and improve the display uniformity.

It should be noted that, as shown in FIG. 1, after the signal line D4 where the fault point N1 is located is repaired using the drive power lines, since two sides of the fault point N1 are short-circuited, the signal transmitted in the signal line D4 no longer passes through the fault point N1, instead it passes through the line portions short-circuiting the fault point N1. Extension lines at two sides of each of the short-circuited line portions of the first repair line V12, V13 and the second repair line V23 are disconnected respectively, so that the drive signals of the drive power lines cannot pass through the line portions between the disconnected positions, for example, the drive signals cannot pass through the line portions between R1 and R2; between R3 and R4; and between R5 and R6. Therefore, the light emitting units (the position where each light emitting unit is located can be called a pixel) near the fault point N1 may have abnormal display problems, which may be bright spots or dark spots (hereinafter referred to as bad pixels), for example, pixels P1, P2, P3 and P4 shown in FIG. 1 are bad pixels (four pixels filled with dots in FIG. 1).

Figure 4:
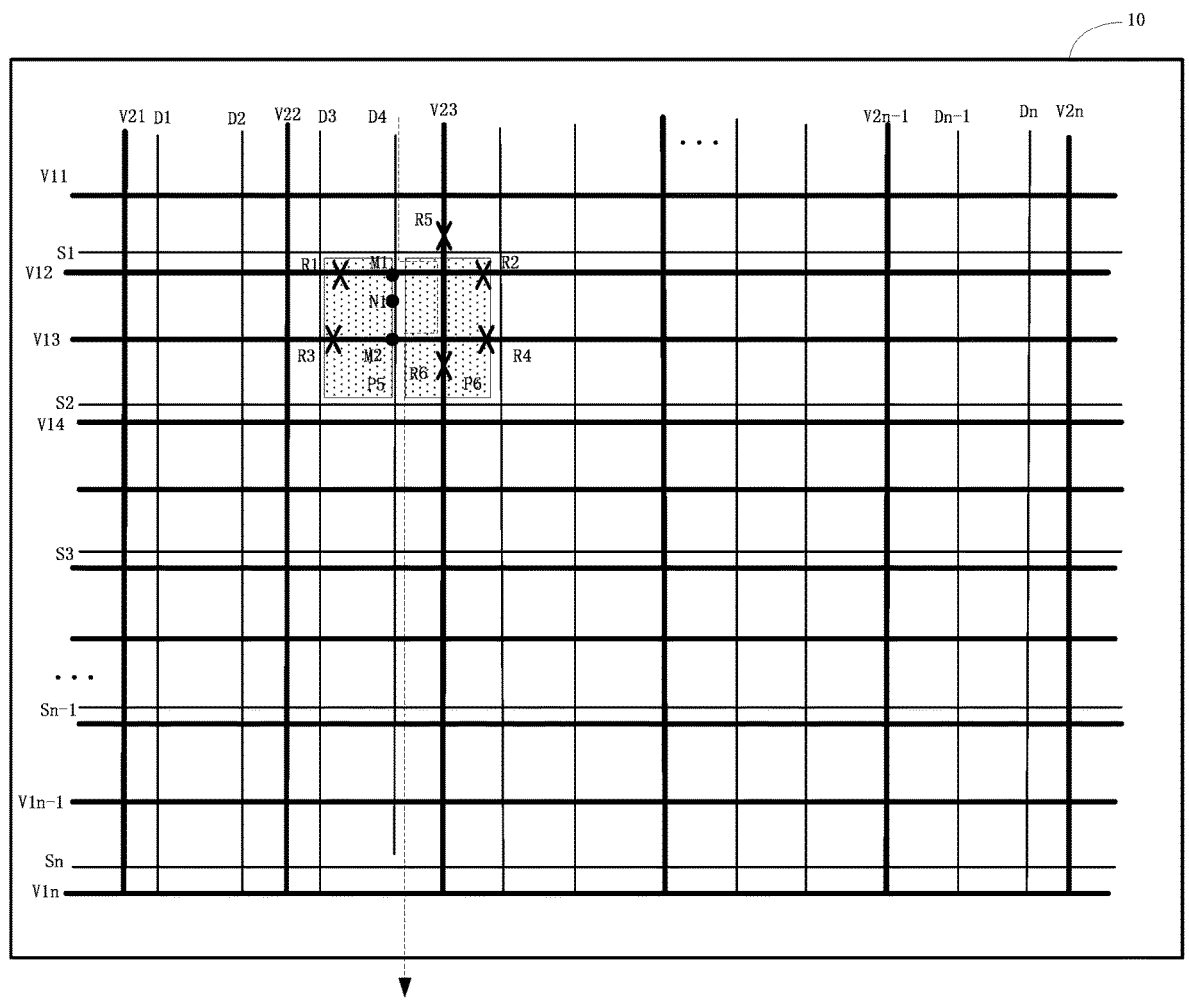
FIG. 4 is a schematic view of a display substrate in yet another embodiment provided by the present disclosure.

If the distance between the drive power lines is small, the number of bad pixels will be smaller. For example, as shown in FIG. 4, assuming that the signal line D4 also has a fault point N1, using the same repairing method, there will be only two bad pixels, pixels P5 and P6. For different display panels, the distance and arrangement mode between each drive power line and each signal line may vary. Therefore, the number and location of bad pixels may be different after repairing the signal line where the fault point is located. However, the number of bad pixels after repairing is usually very small. For the entire display panel, there will be tens of thousands of pixels, and one pixel constitutes only a very small area of the entire display panel and is invisible to the naked eye. Therefore, when there are one or several bad pixels, the overall display effect of the display panel will not be affected. Different display panels have different allowable number of bad pixels, and whether to repair or not can be decided according to the requirements of qualified products of the display panel. If the number of bad pixels after repairing is within the allowable range, the display substrate can be repaired, and the repaired display panel is qualified.

If the number of bad pixels after repairing exceeds the allowable number range, the display substrate will not be repaired.

In some examples, signal lines may have fault points at a plurality of locations. At this time, in the repairing method, two drive power lines (i.e., two first repair lines) located at two sides of each fault point and perpendicular to the signal line where the fault point is located may be welded with the signal line where the fault point is located in the thickness direction of the substrate, i.e., the two first repair lines located at two sides of each fault point can be welded with the signal line where the fault point is located in the thickness direction of the substrate respectively. Alternatively, two drive power lines (i.e., two first repair lines) located at two sides of the plurality of fault points on the same signal line and perpendicular to signal line where the plurality of fault points are located can be welded with the signal line where the fault points are located in the thickness direction of the substrate by laser, i.e., two first repair lines located at two sides of the plurality of fault points on the same signal line are welded with the signal line where the fault points are located in the thickness direction of the substrate respectively.

If a plurality fault points are on a same signal line, the welded positions can be set according to two situations.

In the first situation, there are a plurality of fault points on a same signal line, and the distance between every two adjacent fault points is less than or equal to a first preset value, then a total of two welded positions can be provided, and all the plurality of fault points are located between the two welded positions along the extending direction of the signal line where the fault points are located, that is, the two welded positions are located at two ends of all the plurality of fault points along the extending direction of the signal line where the fault points are located.

In this situation, the two first repair lines at positions between which the plurality of fault points are located are welded with the signal line where the fault points are located in the thickness direction of the substrate.

Figure 5:
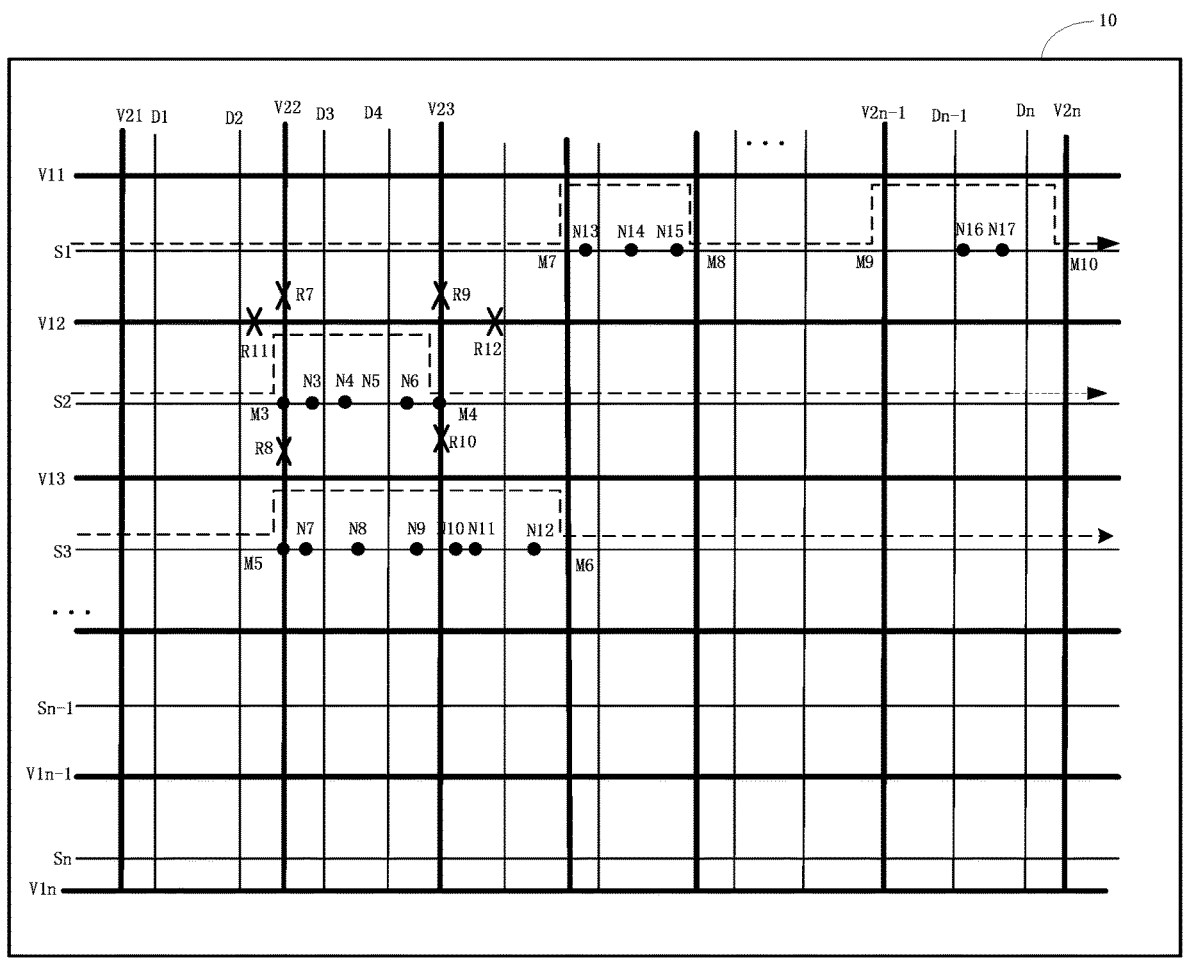
FIG. 5 is a schematic view of a display substrate in another embodiment provided by the present disclosure.

Referring to FIG. 5, the signal line S2 has four fault points N3, N4, N5 and N6, and the distance between every two adjacent fault points is less than or equal to a certain first preset value (the first preset value can be set according to actual needs, for example, it can be set to the size of one pixel or several pixels), i.e. when the distribution of the plurality of the fault points is relatively dense, referring to FIG. 5, two welded positions M3 and M4 may be provided only at two sides of two fault points N3 and N6 located at the two extreme ends of the plurality of fault points, and the four fault points N3, N4, N5 and N6 are located between the welded positions M3 and M4, instead of providing welded positions at two sides of each fault point. Or alternatively, as shown in FIG. 5, the signal line S3 has six fault points N7-N12. In this case, the welded positions may be M5 and M6 as shown in FIG. 5. Of course, when there are a plurality of fault points, the number of allowed bad pixels after repairing should also be considered in determining whether the signal line to be repaired or not.

In this way, the welded positions can be reduced, the repair process can be simplified, and the overall display effect of the display panel can be improved.

In a second situation, there are a plurality of fault points on a same signal line, and if the distance between some adjacent fault points is greater than the first preset value, the plurality of fault points can be divided into at least two fault point groups such that each fault point group includes one fault point or a plurality of fault points, and the distance between every two adjacent fault points in one fault point group is less than or equal to the first preset value, and the distance between fault points in different fault point groups is greater than the first preset value. Then two welded positions can be respectively set for each fault point group, and all fault points in the fault point group are between the two welded positions along the extending direction of the signal line where the fault points are located, that is, the two welded positions are located at two ends of all fault points in the fault point group along the extending direction of the signal line where the fault points are located.

In this case, as to each fault point group, two first repair lines at positions between which the plurality of fault points in the fault point group are located are welded with the signal line where the fault points are located in the thickness direction of the substrate.

Referring to FIG. 5, for example, a signal line S1 has five fault points N13, N14, N15, N16 and N17, and the five fault points can be divided into two fault point groups, the first fault point group includes N13, N14 and N15, the second fault point group includes N16 and N17, and the distance between every two adjacent fault points in one fault point group is less than the first preset value, as shown in FIG. 5, for example, the distance between N13 and N14, the distance between N14 and N15 in the first fault point group is less than the first preset value; the distance between N16 and N17 in the second fault point group is less than the first preset value. Of course, both the first fault point group and the second fault point group may have only one fault point. In this case, the distance between two adjacent fault points in a fault point group can be considered as zero. However, the distance between a fault points in the first fault point group and a fault points in the second fault point group is greater than the first preset value, as shown in FIG. 5, for example, the distance between N15 and N16 is greater than the first preset value. At this time, the welded positions are respectively set for each fault point group. The welded positions in the first fault point group are M7 and M8, and the welded positions in the second fault point group are M9 and M10. The signal line S1 can be repaired through the four welded positions.

In this embodiment, when there are more densely distributed fault points and less densely distributed fault points at the same time, the fault points are grouped according to the density, thus simplifying the repair process and improving the overall display effect of the display panel.

In some examples, the fault points on signal lines mainly include two types: circuit breaking point and short-circuit point. If the fault point is a circuit breaking point, the signal line can be repaired by the repairing method in the above embodiments. If the fault point is a short-circuit point, furthermore, the repairing method may further include:

step S4, disconnecting line portions between the fault point and the welded positions of the signal line where the fault point is located by laser, in this way, the line portions between the fault point and the welded positions of the signal line where the fault point is located are broken.

When a signal line has a short-circuit point, there may be two situations. One is that there is a short-circuit between two adjacent signal lines due to foreign matters, such as residual metal materials or other foreign matters in the manufacturing process. In this case, the signal lines have a short-circuit point. Another situation is that at the intersection point of orthographic projections of a transversely extending signal line and a longitudinally extending signal line towards the substrate, since there is a height difference in the thin film layer between the transversely extending signal line and the longitudinally extending signal line, the insulating layer between them at the location of the height difference is relatively thin and easy to break, thus causing the transversely extending signal line and the longitudinally extending signal line to be short-circuited at the intersection point of their orthographic projections toward the substrate. The above two situations will be respectively explained below with reference to the accompanying drawings.

Figure 6:
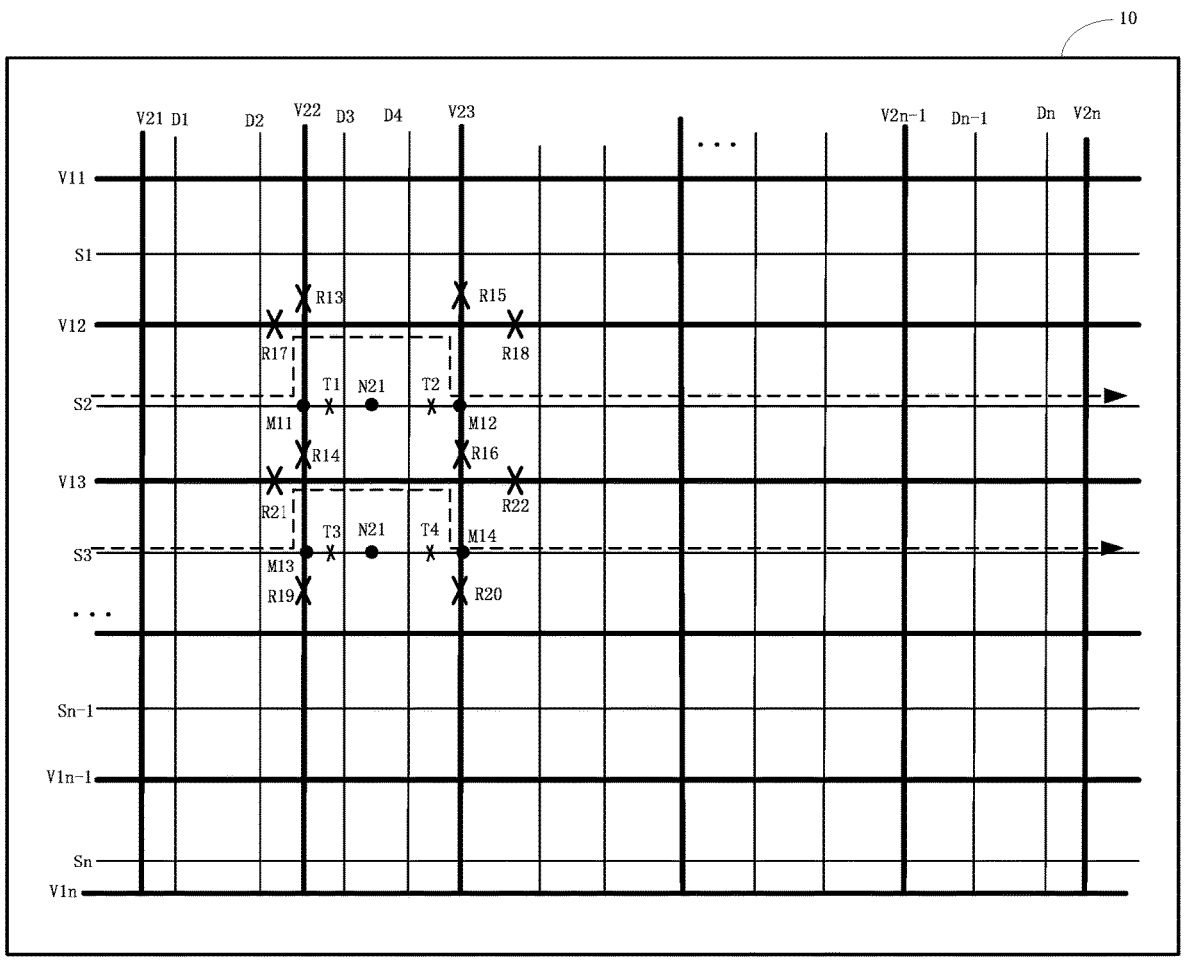
FIG. 6 is a schematic view of a display substrate in a further embodiment provided by the present disclosure.

FIG. 6 shows a situation where a short-circuit occurs between adjacent transversely extending signal lines. Assuming that there is a short-circuit between a signal line S2 and a signal line S3, the signal line S2 and the signal line S3 have the same short-circuit point N21. The signal line S2 is relatively distant from the signal line S3 as shown in FIG. 6. Therefore, the short-circuit point N21 is identified at two positions. In practice, the distance between the signal line S2 and the signal line S3 is very small, and the short-circuit point N21 is located on both the signal line S2 and the signal line S3.

When repairing the signal line S2 and the signal line S3, two welded positions of the signal line S2 are located at two sides of the short-circuit point N21 on the signal line S2, for example, the welded positions include M11 and M12, first repair lines are drive power lines V22 and V23, a second repair line is a drive power line V12, wherein disconnected positions of one first repair line V22 are R13 and R14, disconnected positions of the other first repair line V23 are R15 and R16, and disconnected positions of the second repair line V12 are R17 and R18 (as shown in FIG. 6).

Two welded positions of the signal line S3 are respectively located at two sides of the short-circuit point N21. For example, the welded positions include M13 and M14, wherein disconnected positions of one first repair line V22 are R13 and R19, disconnected positions of the other first repair line V23 are R15 and R20, and disconnected positions of the second repair line V13 are R21 and R22. Here, the first repair lines of the signal line S2 and the signal line S3 are the same, and some of the disconnected positions of the two signal lines may coincide, for example, disconnected positions R14 and R16 are disconnected positions of the two signal lines at the same time.

In order to prevent signal in the signal line from passing through the short-circuit point N21, at this time, as for the signal line S2, the positions between the short-circuit point N21 and the welded positions are disconnected. If a signal of the signal line S2 is input from the left side, it is only necessary to disconnect the line portion between the short-circuit point N21 and the welded position M11, for example, the disconnected position is T1; If a signal of the signal line S2 is input from the right side, it is only necessary to disconnect the line portion between the short-circuit point N21 and the welded position M12, for example, the disconnected position is T2. Therefore, the specific disconnected position can be selected according to the signal input mode of the signal line. Of course, regardless of which side of the signal line the signal is input from, it can be disconnected both at T1 and T2 at the same time.

Similarly, as for the signal line S3, line portions between the short-circuit point N21 and the welded positions are disconnected. If a signal of the signal line S3 is input from the left side, it is only necessary to disconnect the line portion between the short-circuit point N21 and the welded position M13, for example, the disconnected position is T3; If a signal of the signal line S3 is input from the right side, it is only necessary to disconnect the line portion between the short-circuit point N21 and the welded position M14, for example, the disconnected position is T4, or it can be disconnected both at T3 and T4 at the same time.

As to the short-circuit of a transversely extending signal line and a longitudinally extending signal line at the position of intersection of their orthogonal projections toward the substrate, since each welded position and each disconnected position are the same as those of the above-mentioned embodiment, the two signal lines that are short-circuited can be repaired by the same method as that of the above-mentioned embodiment, which will not be repeated here.

In an alternative embodiment, each row of light emitting units extending along the transverse direction of the substrate and/or each column of light emitting units extending along the longitudinal direction of the substrate comprise two drive power lines arranged in parallel.

From the above description, it can be seen that after the fault point is repaired by the drive power lines, since line portions of the drive power lines serving as the first repair lines and the second repair line are disconnected, there may be several bad pixels. In order to reduce the number of bad pixels, each transverse row of light emitting units and each longitudinal column of the light emitting units in this embodiment include two drive power lines arranged in parallel. After the drive power lines serving as the first repair lines and the second repair line are disconnected, the other drive power line parallel to the disconnected first repair lines (or the second repair line) can provide drive signals to the light emitting units between the disconnected positions, so that the provision of drive signals to the light emitting units between the disconnected positions by the drive power lines will not be influenced. Bad pixels caused by disconnection of the drive power lines serving as the first repair lines and the second repair line are avoided, and the number of bad pixels is reduced.

Next, a method for repairing a display substrate of the above-described structure will be described with reference to FIG. 7.

Figure 7:
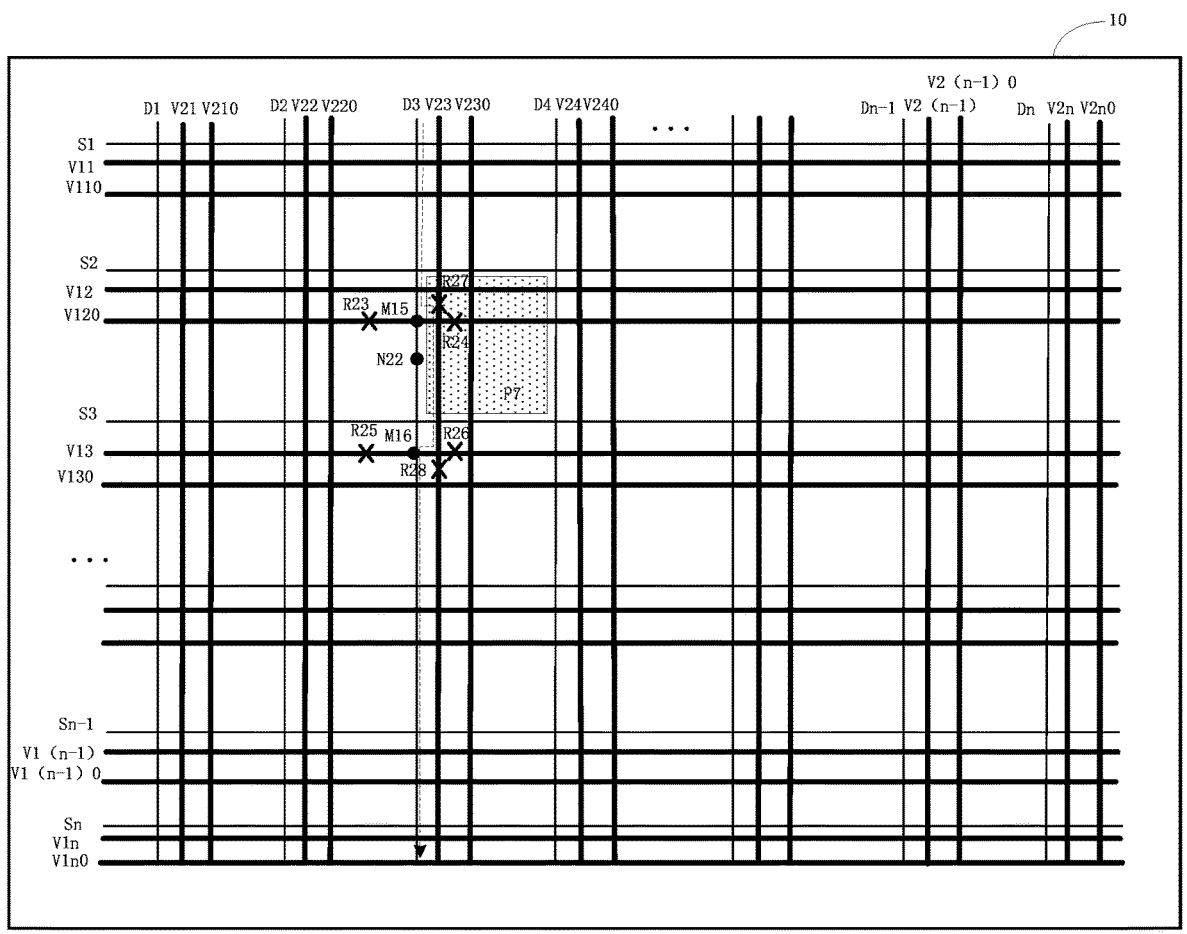
FIG. 7 is a schematic view of a display substrate in yet another embodiment provided by the present disclosure.

As shown in FIG. 7, a plurality of signal lines are formed on a substrate 10, and the signal lines include signal lines S1-Sn extending along a transverse direction of the substrate 10 and signal lines D1-Dn extending along a longitudinal direction of the substrate 10.

Each transversely extending signal line S1-Sn is used to provide corresponding signals (e.g., scanning signals) to each light emitting unit (not shown) of each transverse row, and each longitudinally extending signal line D1-Dn is used to provide corresponding signals (e.g., data signals) to each light emitting unit of each longitudinal column.

Each light emitting unit is located in each area defined by intersections of transversely extending signal lines S1-Sn and longitudinally extending signal lines D1-Dn, for example, each rectangular area P7 defined by intersections of signal lines S1-Sn and signal lines D1-Dn in FIG. 7;

A plurality of drive power lines are also formed on the substrate 10. Each row of light emitting units along the transverse direction of the substrate 10 and each column of light emitting units along the longitudinal direction of the substrate 10 comprise two parallel drive power lines. As shown in FIG. 7, the vicinity of each transverse signal line Sn comprises two drive power lines V1$n$ and V1$n$0, and the two drive power lines are two parallel drive power lines for each corresponding transverse row of light emitting units. The vicinity of each longitudinal signal line Dn includes two parallel drive power lines V2$n$ and V2$n$0, and the two drive power lines are two parallel drive power lines for each corresponding longitudinal column of light emitting units.

Assuming that a longitudinally extending signal line D3 has a fault point N22, the signal line D3 can be repaired by the method in the above embodiment, with the drive power lines V120 and V13 serving as the first repair lines, the drive power line V23 serving as the second repair line, the welded positions being M15 and M16 respectively, and the disconnected positions of the first repair line V120 being e.g., R23 and R24; the disconnected positions of the other first repair line V13 are, e.g., R25 and R26; the disconnected positions of the second repair line V23 are, for example, R27 and R28. After the signal line D3 is repaired, the route through which the signal in the signal line D3 passes can be seen in a dashed line with arrow shown in FIG. 7.

From the above route through which the signal passes, it can be seen that since two sides of the fault point N22 are short-circuited, the signal transmitted in the signal line D3 no longer passes through the fault point N22. The first repair lines V120 and V13 and the second repair line V23 are disconnected at extension lines at two sides of their short-circuited line portions, respectively, and signal in the drive power lines cannot pass through the line portions between the disconnected positions, for example, the line portion between R23 and R24, the line portion between R25 and R26, and the line portion between R27 and R28. However, as for the first repair line V120, there is one drive power line V12 parallel to it as a backup line. Although the drive signal cannot pass through the line portion between the two disconnected positions through which the first repair line V120 passes, i.e., the line portion between R23 and R24, since the drive power lines are connected to each other, the drive signal can be transmitted to the backup drive power line V12 through other drive power lines, and through the backup drive power line V12, the drive signal can still be supplied to the light emitting unit through which the line portion between R23 and R24 passes.

Similarly, the other first repair line V13 also has a drive power line V130 parallel to it as a backup drive power line. The drive signal can be transmitted to the backup drive power line V130 through other drive power lines, and through the backup drive power line V130, the drive signal can still be supplied to the light emitting unit through which the line portion between R25 and R26 passes. As for the second repair line V23, there is also a drive power line V230 parallel to it as a backup drive power line. Drive signals can be transmitted to the backup drive power line V230 through other drive power lines. Through the backup drive power line V230, drive signals can still be supplied to the light emitting unit through which the line portion between R27 and R28 passes.

However, as for the display substrate shown in FIG. 7, since the fault point N22 of the signal line D3 passes through a pixel P7, after the above repairing, although the drive signal can be transmitted to the pixel P7, the pixel P7 is still a bad pixel because the signal in the signal line D3 cannot pass through the position where the pixel P7 is located, but other pixels near the fault point N22 can be normally displayed and are not bad pixels. If the distance between the drive power lines is the distance shown in FIG. 4, there will be no bad pixels after the above repairing.

From the above description, it can be seen that since each row of light emitting units includes two corresponding drive power lines, after repairing, the number of bad pixels is reduced compared with the situation without backup drive power lines before. Therefore, the solution of this embodiment can reduce the number of bad pixels, improve the repair effect, and improve the yield of the display substrate.

It should be noted that the above structure of the display substrate shown in FIGS. 1-7 only schematically represents each signal line, drive power line, fault point, welded position and disconnected position, etc. In the actual structure of the display substrate, the above-mentioned structures are microscopic structures and are invisible to the naked eye. Therefore, it can be understood that the display substrate repaired according to the above-solution will not affect the overall display effect of the display panel using the display substrate.

In each repairing method of the above embodiment, the signal line where the fault point is located is repaired by laser. Because of high collimation of laser, the corresponding welded or disconnected positions can be accurately positioned, and the repair effect can be improved.

According to the display substrate and the repairing method thereof in some embodiments of the present disclosure, the signal line where the fault point is located can be repaired by short-circuiting two sides of the at least one fault point through line portions of two drive power lines which are respectively located at two sides of the at least one fault point and perpendicular to the signal line where the at least one fault point is located and a line portion of a drive power line which is located at one side of the at least one fault point and parallel to the signal line where the at least one fault point is located. After the signal line where the fault point is located is repaired, the signal transmitted in the signal line no longer passes through the position of the fault point, but instead passes through line portions of the drive power lines short-circuiting the fault point, and the repaired signal line can normally transmit signals, so that bright lines or dark lines do not exist during display, thereby improving the yield of the display substrate and the yield of the display panel using the display substrate.

The embodiment of the present disclosure also provides a display panel, which includes the display substrate of any of the above embodiments. The display panel can be used as electronic paper, mobile phone, tablet computer, television, display, notebook computer, digital photo frame, navigator and other product or component with display functions.

Those skilled in the art will understand that the drawings are only schematic views of some alternative embodiments, and the modules or processes in the drawings are not necessarily to implement the present disclosure. The above description is only a specific embodiment of the present disclosure, but the scope of protection of the present disclosure is not limited to this. Any person familiar with the technical field can easily think of changes or substitutions within the technical scope of the present disclosure, and should be covered within the scope of protection of the present disclosure. Therefore, the scope of protection of the present disclosure should be based on the scope of protection of the claims.

The invention claimed is:

1. A method for repairing a display substrate, comprising:
providing the display substrate, wherein the display substrate comprises a base substrate, a plurality of light emitting units on the base substrate, and a plurality of signal lines on the base substrate, wherein the plurality of signal lines comprise first signal lines extending along a transverse direction of the base substrate and second signal lines extending along a longitudinal direction of the base substrate, wherein the first signal lines and the second signal lines are insulated from each other, and a plurality of drive power lines on the base substrate, wherein the plurality of drive power lines comprise first drive power lines extending along the transverse direction of the base substrate and second drive power lines extending along the longitudinal direction of the base substrate, which are mutually connected and are used for providing a driving voltage to each light emitting unit, wherein the plurality of drive power lines are insulated from the signal lines;

detecting whether there is a fault point on the signal lines; and when at least one fault point is detected on a signal line, short-circuiting two sides of the at least one fault point through first line portions of two drive power lines of the plurality of drive power lines and a second line portion of a drive power line of the plurality of drive power lines, wherein the two drive power lines are respectively at two sides of the at least one fault point and are perpendicular to a signal line of the plurality of signal lines where the at least one fault point is located, wherein the second line portion of the drive power line of the plurality of drive power lines is at one side of the at least one fault point and parallel to the signal line where the at least one fault point is located, and wherein the two drive power lines respectively at two sides of the at least one fault point and perpendicular to the signal line where the at least one fault point is located comprise first repair lines, and wherein the drive power line at one side of the at least one fault point and parallel to the signal line comprises a second repair line, wherein the short-circuiting comprises:

welding the first repair lines to the signal line where the fault point is located respectively in a thickness direction of the base substrate by laser, disconnecting extension lines respectively at two sides of line portions of the first repair lines for short-circuiting by the laser, and disconnecting extension lines respectively at two sides of line portions of the second repair line for short-circuiting by the laser.

2. The repairing method according to claim 1, wherein the short-circuiting further comprises:

disconnecting line portions located between the fault point and welded positions of the signal line where the fault point is located by the laser.

3. The repairing method according to claim 1, wherein when a number of the at least one fault point is greater than 1 and a distance between adjacent fault points is less than or equal to a first preset value, two welded positions are set such that the two welded positions are positioned at two ends of a plurality of fault points along an extending direction of the signal line where two or more fault points are located, wherein when the number of the at least one fault point is greater than 1 and a distance between adjacent fault points is greater than the first preset value, the plurality of fault points are divided into at least two fault point groups, wherein each of the two fault point groups comprise one fault point or a plurality of fault points, wherein a distance between adjacent fault points in a first fault point group of the at least two fault point groups is less than or equal to the first preset value, wherein a distance between fault points in a second fault point group of the at least two fault point groups is greater than the first preset value, wherein two welded positions are respectively set for each of the two fault point groups, and wherein the two welded positions are positioned at two ends of the fault points in a same fault point group along the extending direction of the signal line where the fault points are located.

4. The repairing method according to claim 1, wherein, disconnecting the extension lines respectively at two sides of the line portions of the first repair lines for short-circuiting by the laser comprises disconnecting extension lines of short-circuited line portions of two drive power lines which are located at two sides of the fault point and perpendicular to the signal line where the fault point is located and closest to the fault point, and wherein disconnecting extension lines respectively at two sides of the line portions of the second repair line for short-circuiting by the laser comprises disconnecting extension lines of a short-circuited line portion of the drive power line which is located at one side of the fault point, parallel to the signal line where the fault point is located, and closest to the fault point.

5. A display substrate comprising:

a base substrate;

a plurality of light emitting units on the base substrate;

a plurality of signal lines on the base substrate, wherein the plurality of signal lines comprise first signal lines extending along a transverse direction of the base substrate and second signal lines extending along a longitudinal direction of the base substrate, wherein the first signal lines and the second signal lines are insulated from each other; and a plurality of drive power lines on the base substrate, wherein the plurality of drive power lines comprise first drive power lines extending along the transverse direction of the base substrate and second drive power lines extending along the longitudinal direction of the base substrate, which are mutually connected and are used for providing a driving voltage to each light emitting unit, wherein the plurality of drive power lines are insulated from the signal lines, wherein at least one of the plurality of signal lines has at least one fault point, wherein two sides of the at least one fault point are short-circuited through first line portions of two drive power lines of the plurality of drive power lines and a second line portion of a drive power line of the plurality of drive power lines, wherein the two drive power lines are respectively at two sides of the at least one fault point and are perpendicular to a signal line of the plurality of signal lines where the at least one fault point is located, wherein the second line portion of the drive power line of the plurality of drive power lines is at one side of the at least one fault point and parallel to the signal line where the at least one fault point is located, wherein the two drive power lines respectively at two sides of the at least one fault point and perpendicular to the signal line where the at least one fault point is located comprise first repair lines, and wherein the drive power line at one side of the at least one fault point and parallel to the signal line comprises a second repair line, wherein the first repair lines are welded to the signal line where a fault point of the at least one fault point is located respectively in a thickness direction of the base substrate by laser, wherein extension lines respectively at two sides of each of short-circuited line portions of the first repair lines are disconnected by the laser, and wherein extension lines respectively at two sides of a short-circuited line portion of the second repair line are disconnected by the laser.

6. The display substrate according to claim 5, wherein, the first repair lines comprise two drive power lines which are respectively located at two sides of the fault point, and are perpendicular to the signal lines where the fault point is located and closest to the fault point, wherein the second repair line is a drive power line located at one side of the fault point, parallel to the signal line where the fault point is located and closest to the fault point.

7. The display substrate according to claim 5, wherein line portions between the fault point and welded positions of the signal line where the fault point is located are disconnected.

8. The display substrate according to claim 5, wherein a number of the at least one fault point is greater than 1, wherein a distance between adjacent fault points is less than or equal to a first preset value, wherein there are two welded positions, and wherein the two welded positions are positioned at the two ends of the plurality fault points along an extending direction of the signal line where the fault points are located.

9. The display substrate according to claim 5, wherein a number of the at least one fault point is greater than 1, wherein a distance between adjacent fault points is greater than a first preset value, wherein the at least one fault point comprises a plurality of fault points that are in at least two fault point groups, wherein each of the at least two fault point groups comprises one fault point or a plurality of fault points, wherein a distance between adjacent fault points in a first fault point group of the at least two fault point groups is less than or equal to the first preset value, wherein a distance between adjacent fault points in a first fault point group of the at least two fault point groups is less than or equal to the first preset value, wherein each fault point group is provided with two welded positions respectively, and wherein the two welded positions are at two ends of the fault points in a same fault point group along the extending direction of the signal line where the fault points are located.

10. The display substrate according to claim 5, wherein, each row of light-emitting units along the transverse direction of the base substrate and/or each column of light-emitting units along the longitudinal direction of the base substrate comprise corresponding two parallel driving power lines.

11. The display substrate according to claim 5, wherein the fault point is a circuit breaking point or a short-circuit point.

12. A display panel comprising the display substrate according to claim 5.

* * * * *